(12) United States Patent
Huang et al.

(10) Patent No.: US 11,031,369 B2
(45) Date of Patent: *Jun. 8, 2021

(54) APPARATUS FOR BOND WAVE PROPAGATION CONTROL

(71) Applicant: Taiwan Semiconductor Manufacturing Co., Ltd., Hsin-Chu (TW)

(72) Inventors: Xin-Hua Huang, Xihu Township (TW); Kuan-Liang Liu, Pingtung (TW); Kuo Liang Lu, Hsinchu (TW); Ping-Yin Liu, Yonghe (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/654,377

(22) Filed: Oct. 16, 2019

(65) Prior Publication Data

US 2020/0051950 A1    Feb. 13, 2020

Related U.S. Application Data

(63) Continuation of application No. 15/935,309, filed on Mar. 26, 2018, now Pat. No. 10,497,667.
(Continued)

(51) Int. Cl.
*B23K 37/04* (2006.01)
*H01L 23/00* (2006.01)
(Continued)

(52) U.S. Cl.
CPC .............. *H01L 24/94* (2013.01); *B23K 37/04* (2013.01); *B23K 37/0408* (2013.01);
(Continued)

(58) Field of Classification Search
CPC .. H01L 24/94; H01L 21/6831; H01L 21/6838; H01L 21/67092; H01L 21/2007;
(Continued)

(56) References Cited

U.S. PATENT DOCUMENTS 3,520,055 A    7/1970   Jannett
4,715,526 A    12/1987  MacNeil
(Continued)

FOREIGN PATENT DOCUMENTS

JP    2838810 A    3/1992
JP    4231362 A    3/2005
(Continued)

OTHER PUBLICATIONS

Usenko, A.Y. "Humidty Effects on Substrate Bonding for Silicon-on-Glass." .Corning, Inc., ECS Transactions, 35 (5) 111-115 (2011).
(Continued)

*Primary Examiner* — Kiley S Stoner
(74) *Attorney, Agent, or Firm* — Eschweiler & Potashnik, LLC

(57) ABSTRACT

An apparatus and method is provided for controlling a propagation of a bond wave during semiconductor processing. The apparatus has a first chuck to selectively retain a first workpiece. A second chuck selectively retains a second workpiece. The first and second chucks selectively secure at least a periphery of the respective first workpiece and second workpiece. An air vacuum is circumferentially located in a region between the first chuck and second chuck. The air vacuum is configured to induce a vacuum between the first workpiece and second workpiece to selectively bring the first workpiece and second workpiece together from a propagation point. The air vacuum can be localized air vacuum guns, a vacuum disk, or an air curtain positioned about the periphery of the region between the first chuck and second
(Continued)

chuck. The air curtain induces a lower pressure within the region between the first and second chucks.

20 Claims, 8 Drawing Sheets

Related U.S. Application Data

(60) Provisional application No. 62/563,227, filed on Sep. 26, 2017.

(51) Int. Cl.
| | | |
|---|---|---|
| H01L 21/683 | (2006.01) | |
| H01L 21/67 | (2006.01) | |
| H01L 21/20 | (2006.01) | |
| H01L 21/762 | (2006.01) | |
| B23K 101/40 | (2006.01) | |

(52) U.S. Cl.
CPC .... *H01L 21/2007* (2013.01); *H01L 21/67092* (2013.01); *H01L 21/6831* (2013.01); *H01L 21/6838* (2013.01); *H01L 21/76251* (2013.01); *H01L 24/75* (2013.01); *H01L 24/83* (2013.01); *B23K 2101/40* (2018.08); *H01L 2224/753* (2013.01); *H01L 2224/759* (2013.01); *H01L 2224/75704* (2013.01); *H01L 2224/75724* (2013.01); *H01L 2224/75744* (2013.01); *H01L 2224/83209* (2013.01); *H01L 2224/83894* (2013.01); *H01L 2224/83908* (2013.01); *H01L 2924/1203* (2013.01); *H01L 2924/12043* (2013.01); *H01L 2924/1304* (2013.01); *H01L 2924/1434* (2013.01); *H01L 2924/1461* (2013.01)

(58) Field of Classification Search
CPC ... H01L 21/76251; H01L 24/75; H01L 24/83; H01L 2924/12043; H01L 2924/1304; H01L 2924/1434; H01L 2924/1461; H01L 2924/1203; H01L 2224/753; H01L 2224/83908; H01L 2224/75744; H01L 2224/75704; B23K 37/04; B23K 37/0408; B23K 2101/40

See application file for complete search history.

(56) References Cited

U.S. PATENT DOCUMENTS

| | | | |
|---|---|---|---|
| 8,119,500 B2 | 2/2012 | Yang et al. | |
| 8,758,552 B2* | 6/2014 | Canale | H01L 21/67092 |
| | | | 156/707 |
| 9,490,158 B2 | 11/2016 | Huang et al. | |
| 9,754,813 B2 | 9/2017 | Huang et al. | |
| 10,249,526 B2 | 4/2019 | Parkhe | |
| 2001/0002283 A1 | 5/2001 | Sun et al. | |
| 2002/0006680 A1 | 1/2002 | Katala et al. | |
| 2003/0173017 A1* | 9/2003 | Hecht | H01L 21/6838 |
| | | | 156/154 |
| 2003/0178468 A1 | 9/2003 | Lee et al. | |
| 2004/0218340 A1 | 11/2004 | Kitabayashi et al. | |
| 2004/0226652 A1 | 11/2004 | Murata et al. | |
| 2005/0082274 A1 | 4/2005 | Kondou et al. | |
| 2005/0092816 A1* | 5/2005 | Lee | H01L 21/6831 |
| | | | 228/180.22 |
| 2005/0095776 A1 | 5/2005 | Usuami | |
| 2007/0105459 A1 | 5/2007 | Aruga et al. | |
| 2008/0037196 A1 | 2/2008 | Yonekura et al. | |
| 2010/0168908 A1* | 7/2010 | Maeda | H01L 24/34 |
| | | | 700/228 |
| 2011/0042010 A1 | 2/2011 | Thllner | |
| 2011/0043784 A1* | 2/2011 | Aoki | G03F 7/707 |
| | | | 355/72 |
| 2011/0214809 A1* | 9/2011 | Sugiyama | H01L 21/67092 |
| | | | 156/285 |
| 2012/0006463 A1 | 1/2012 | Gaudin | |
| 2012/0064256 A1* | 3/2012 | Higashijima | H01L 21/68785 |
| | | | 427/532 |
| 2013/0056905 A1 | 3/2013 | Hamaya et al. | |
| 2013/0168929 A1* | 7/2013 | Erickson | H01L 21/68 |
| | | | 279/3 |
| 2013/0201596 A1 | 8/2013 | Chen et al. | |
| 2015/0044786 A1 | 2/2015 | Huang et al. | |
| 2015/0059985 A1 | 3/2015 | Matsunaga et al. | |
| 2015/0116889 A1 | 4/2015 | Yamasaki et al. | |
| 2015/0214088 A1* | 7/2015 | Nakao | B25J 15/0616 |
| | | | 156/707 |
| 2016/0155721 A1 | 6/2016 | Sugakawa et al. | |
| 2016/0204020 A1 | 7/2016 | Huang et al. | |
| 2017/0133243 A1 | 5/2017 | Thallner | |
| 2017/0182758 A1 | 6/2017 | Simmons et al. | |
| 2017/0221856 A1 | 8/2017 | Yamauchi | |
| 2018/0019225 A1 | 1/2018 | Matsunaga et al. | |
| 2018/0019226 A1 | 1/2018 | Matsunaga et al. | |
| 2018/0076037 A1* | 3/2018 | Kurz | H01L 21/187 |
| 2018/0158796 A1 | 6/2018 | Otsuka et al. | |
| 2019/0111547 A1 | 4/2019 | Sekiya | |
| 2019/0148333 A1 | 5/2019 | Chen et al. | |
| 2019/0189593 A1* | 6/2019 | Kim | H01L 21/68742 |
| 2020/0013643 A1* | 1/2020 | Kim | H01L 21/681 |
| 2020/0020562 A1* | 1/2020 | Sohn | H01L 21/67109 |
| 2020/0055296 A1* | 2/2020 | Kim | H01L 21/68735 |

FOREIGN PATENT DOCUMENTS

| | | | |
|---|---|---|---|
| JP | 2005072034 A | 3/2005 | |
| KR | 20140120785 A | 10/2014 | |
| TW | 201431669 A | 8/2014 | |
| TW | 201622028 A | 6/2016 | |
| WO | 2007013445 A1 | 2/2009 | |
| WO | WO-2013058052 A1 * | 4/2013 | ....... H01L 21/67092 |

OTHER PUBLICATIONS

Notice of Allowance dated Jul. 31, 2019 for U.S. Appl. No. 15/935,309.

* cited by examiner

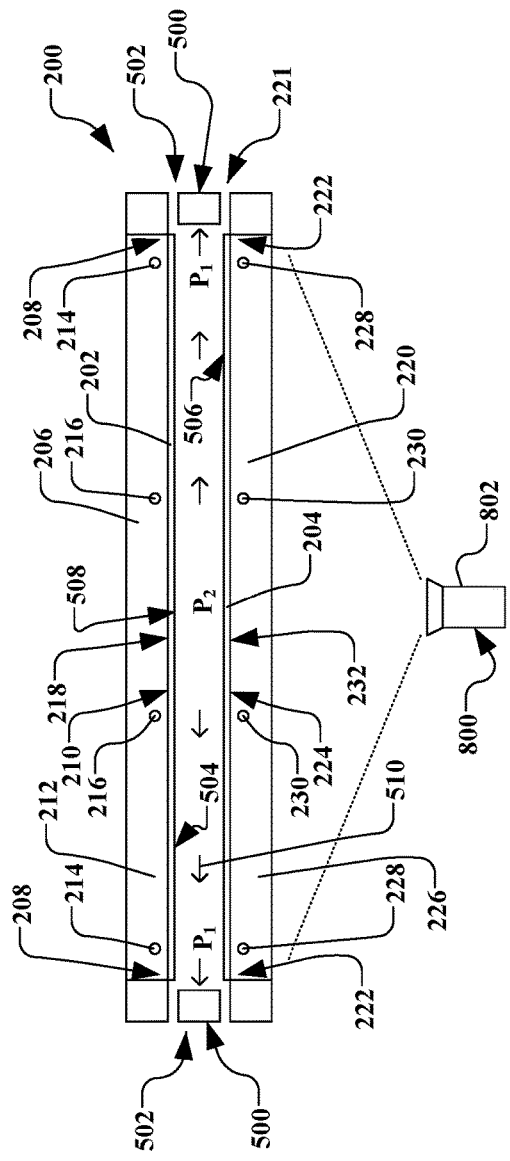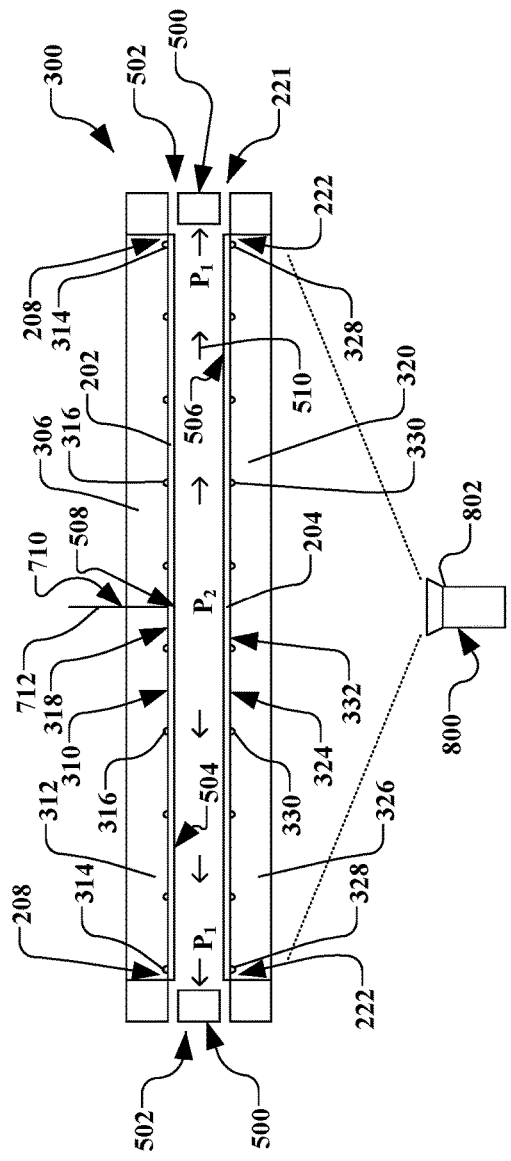

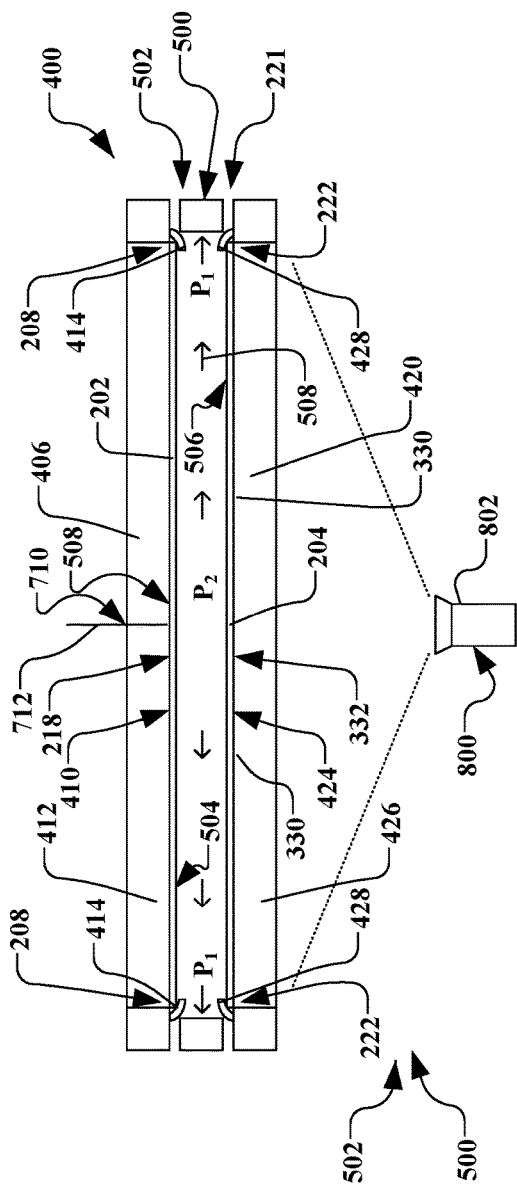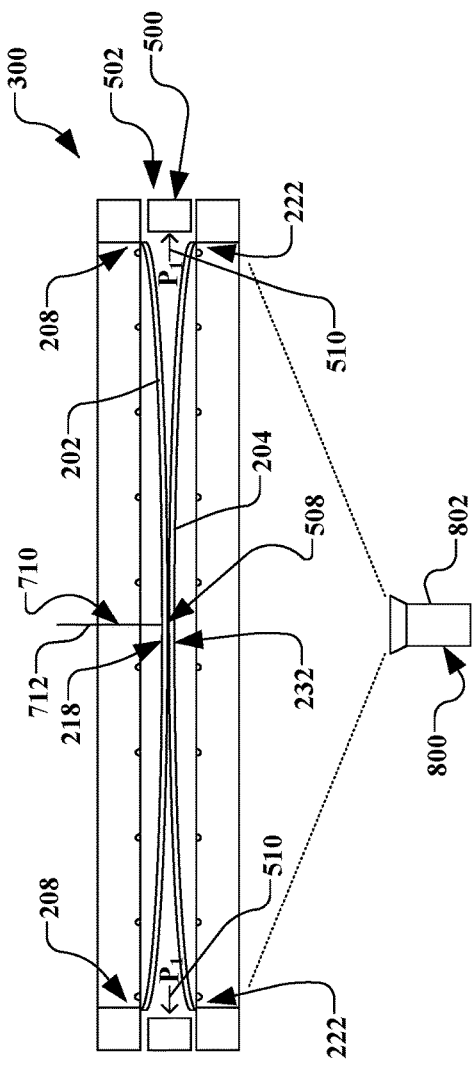

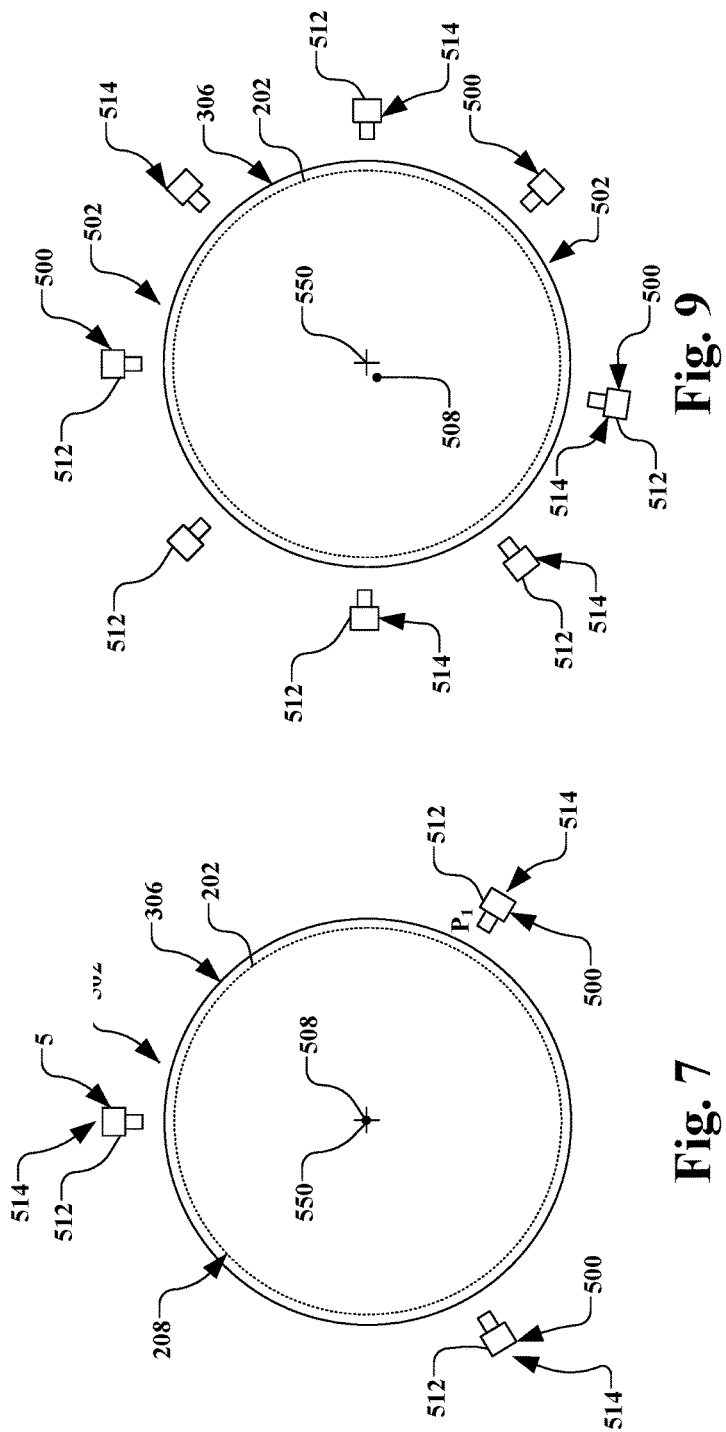
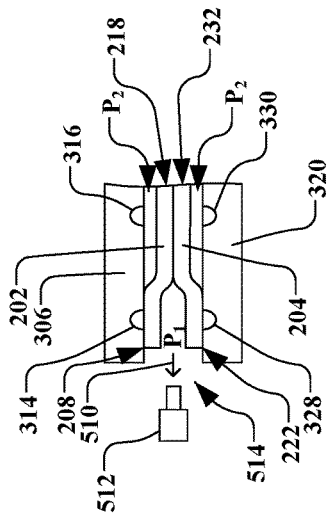
Fig. 7
Fig. 8
Fig. 9

APPARATUS FOR BOND WAVE PROPAGATION CONTROL

REFERENCE TO RELATED APPLICATIONS

This application is a Continuation of U.S. application Ser. No. 15/935,309, filed on Mar. 26, 2018, which claims the benefit of U.S. Provisional Application No. 62/563,227, filed on Sep. 26, 2017. The contents of the above-referenced patent applications are hereby incorporated by reference in their entirety.

BACKGROUND

Moore's law refers to an observation made by Intel co-founder Gordon Moore in 1965. Moore noticed that the number of transistors per square inch on integrated circuits had doubled every year since their invention. The small feature size allows hundreds of thousands, even millions, of devices to be fabricated on a wafer. However, the proximity of adjacent transistors may result in devices of the transistors suffering from poor metal layer isolation or result in leakage current between devices, which degrades performance. Integrated chips are fabricated through a plurality of processing steps (e.g., etching steps, lithography steps, deposition steps, etc.) upon a semiconductor wafer (e.g., a silicon wafer), followed by dicing the semiconductor wafer into separate integrated chips. In order to realize higher integration, simplify packaging processes, or couple circuits or other components, etc., in some cases, two or more wafers are bonded together before the dicing step, and circuits are fabricated on both sides of the wafer after thin down. Wafer level bonding is a promising technology for "More than Moore", where added value is provided to devices by incorporating functionality that does not necessarily scale according to Moore's Law.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a schematic cross-sectional view of some embodiments of an example bonding apparatus prior to a bonding of two workpieces.

FIG. 4 illustrates a schematic cross-sectional view of some embodiments of another example bonding apparatus prior to a bonding of two workpieces.

FIG. 5 illustrates a schematic cross-sectional view of some embodiments of yet another example bonding apparatus prior to a bonding of two workpieces.

FIG. 6 illustrates a schematic cross-sectional view of some embodiments of another example bonding apparatus concurrent with a bonding of two workpieces according to the embodiment of FIG. 4.

FIG. 7 illustrates a schematic plan view of some embodiments of a bonding apparatus consistent having a plurality of vacuum guns.

FIG. 8 illustrates a partial cross-sectional view of some embodiments of a bonding apparatus having a plurality of vacuum guns.

FIG. 9 illustrates a schematic plan view of some embodiments of another bonding apparatus having a plurality of vacuum guns.

DETAILED DESCRIPTION

Figure 2:
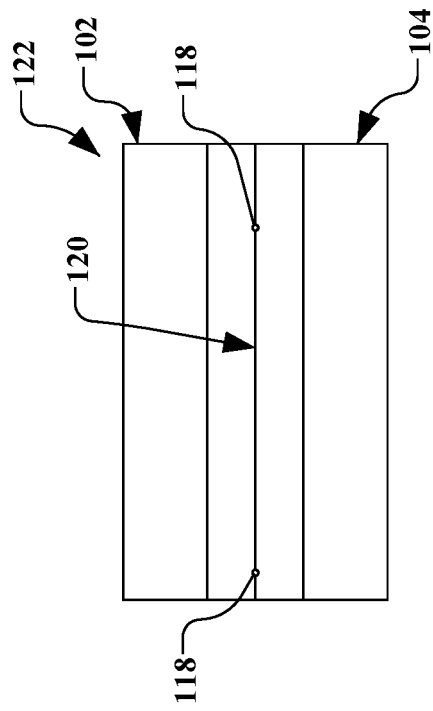
FIG. 2 illustrates a schematic cross-sectional view of some embodiments of two workpieces after being bonded.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element may be referred to as a "first" element in some embodiments, the element may be referred to as a "second" element in other embodiments.

Semiconductor chips used in electronic devices typically comprise a semiconductor die mounted on a carrier or a substrate. In an effort to increase the density and functionality of a semiconductor chip, attempts have been made to create 3D-ICs, or three-dimensional integrated circuits. Generally, 3D-ICs comprise a plurality of semiconductor dies stacked upon each other, such as one semiconductor die bonded on top of another semiconductor die. Electrical connections electrically couple contact pads on each of the stacked semiconductor dies to external contacts. The dies may include different functionality or simply increase the density of a single functionality, such as a memory.

Generally, attempts at creating 3D-ICs have included bonding a first wafer on which a plurality of dies has been formed to a second wafer, also on which a plurality of dies has been formed. The wafers are aligned such that the dies of one wafer are aligned with dies of the other wafer. As mentioned above, the dies of the wafers may have a different function or provide increased density for a single type of function, such as memory. Once bonded, a thinning process is typically performed to form electrical connections, typically by exposing a through silicon via that is electrically coupled to the bottom wafer.

The present disclosure generally relates to a semiconductor processing manufacturing apparatus and a method for controlling pressure and manipulating a bonding wave wafer-level bonding, whereby the present disclosure mitigates defects previously seen during such bonding. The general purposes of the present disclosure include an apparatus and method for providing a vacuum apparatus (e.g., an air vacuum) circumferentially located in a region between a first chuck and second chuck, wherein each of the first chuck and second chuck are respectively configured to selectively secure at least a periphery of a respective first workpiece and second workpiece (e.g., a substantially round semiconductor wafer). The vacuum apparatus, for example, may comprise a plurality of localized vacuum guns positioned at a respective plurality of locations about the periphery of the region between the first chuck and second chuck. In another example, the vacuum apparatus may alternatively comprise a vacuum disk positioned about the periphery of the region between the first chuck and second chuck, wherein the air vacuum disk provides a substantially uniform vacuum about the periphery. In another example, the vacuum apparatus may still further alternatively comprise an air or gas curtain positioned about the periphery of the region between the first chuck and second chuck, wherein the air or gas curtain is configured to emit air at a first pressure along a path that is not parallel to the first and second chucks, and wherein the air curtain is configured to induce a vacuum or lower pressure within the region between the first and second chucks.

The vacuum apparatus of the present disclosure, for example, is configured to induce a vacuum between the first workpiece and second workpiece, therein selectively bringing the first workpiece and second workpiece together from a propagation point. The propagation point, for example, is preferably centered with respect to the surfaces of the first workpiece and second workpiece, wherein the propagation point may be provided by an apparatus configured to selectively press one or more of the first workpiece and second workpiece toward the other at the propagation point. In another example, a wide-angle IR CCD or other displacement sensing device is further provided to monitor a bond wave between the first workpiece and second workpiece concurrent with the bonding thereof. The present disclosure thus includes a novel apparatus and method for controlling a propagation of a bond wave during wafer-level bonding. The present disclosure further advantageously provides a reduction of edge defects (e.g., bubbles or other defects) in the resulting bonded first and second workpieces, and further provides a more uniform bonding therebetween.

Figure 1:
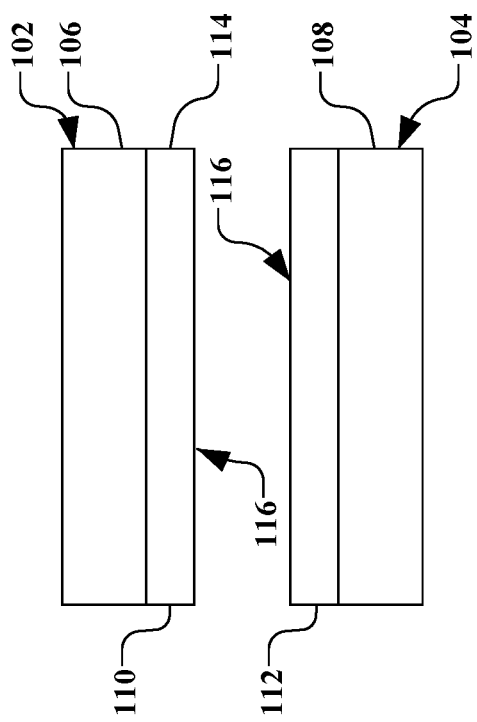
FIG. 1 illustrates a schematic cross-sectional view of some embodiments of two workpieces prior to being bonded.

In order to gain a better understanding of the disclosure, reference is now made to FIG. 1, wherein a first workpiece 102 and a second workpiece 104 are illustrated. The first workpiece 102 and second workpiece 104, for example, are being prepared to be bonded in accordance with one example embodiment of the present invention. The first workpiece 102 and the second workpiece 104, for example, comprise a first semiconductor substrate 106 and a second semiconductor substrate 108, respectively, whereby electronic circuitry (not shown) has been formed thereon. The first semiconductor substrate 106 and the second semiconductor substrate 108, for example, may each comprise bulk silicon (Si) that has been either doped or remains undoped. In one alternative example, one or more of the first semiconductor substrate 106 and the second semiconductor substrate 108 comprise an active layer of a semiconductor-on-insulator (SOI) substrate. In general, an SOI substrate comprises a layer of a semiconductor material, such as silicon, formed on an insulating layer. For example, the insulating layer, for example, may comprise a buried oxide (BOX) layer or a silicon oxide layer. The insulating layer, for example, is provided on a substrate, which may be a silicon or glass substrate. The present disclosure contemplates other substrates being employed, such as a multi-layered or gradient substrate. In other examples, substrates comprising microelectromechanical systems (MEMS) can be bonded to one another in accordance with the present disclosure. In accordance with other examples, the present disclosure contemplates substrates used in hybrid bonding using two masks, or other substrates from a hybrid system having a non-MEMS device and a MEMS device.

While not shown, the electronic circuitry that has been formed on the substrate can comprise any type of circuitry suitable for a particular application. In one example embodiment, the circuitry includes electrical devices formed on the substrate with one or more dielectric layers overlying the electrical devices. Metal layers may be formed between dielectric layers to route electrical signals between the electrical devices. Electrical devices may also be formed in the one or more dielectric layers.

In one example, the electronic circuitry can include various N-type metal-oxide semiconductor (NMOS) and/or P-type metal-oxide semiconductor (PMOS) devices, such as transistors, capacitors, resistors, diodes, photo-diodes, fuses, and the like, whereby such components are interconnected to form structures that are configured to perform one or more functions. The one or more functions can be performed by various structures such as memory structures, processing structures, sensors, amplifiers, power distribution structures, input/output circuitry, or various other structures. It is to be appreciated that the above-described examples are provided for illustrative purposes to gain a better understanding of the disclosure, and said examples are not meant to limit the present invention in any manner. It is to be understood that various other electronic circuitry can be implemented to perform various applications, and all such applications are contemplated as falling within the scope of the present disclosure.

In one example, the first workpiece 104 and the second workpiece 106 may have a first interconnect layer 110 and a second interconnect layer 112 respectively formed thereon. Each of the first interconnect layer 110 and the second interconnect layer 112 may include one or more dielectric layers 114, whereby the one or more dielectric layers may be formed of a low-K dielectric material, silicon oxide, phosphosilicate glass (PSG), borophosphosilicate glass (BPSG), fluorinated silicate glass (FSG), or the like, by any suitable method known in the art. The one or more dielectric layers 114 comprise an oxide that may be formed by chemical vapor deposition (CVD) techniques using tetra-ethyl-ortho-silicate (TEOS) and oxygen as a precursor. Other materials and processes may be used. It should also be noted that the dielectric layers 114 may each comprise a plurality of dielectric layers, with or without an etch stop layer formed between dielectric layers.

Prior to bonding of the first workpiece 102 and second workpiece 104, various cleaning and bonding preparation steps may be taken. For example, RCA cleaning, including removal of organic contaminants (e.g., an organic clean and particle clean step), removal of a thin oxide layer (e.g., an oxide strip step), and/or a removal of ionic contamination may be performed on the first workpiece 102 and second workpiece 104. Surfaces 116 of the first workpiece 102 and second workpiece 104 may be activated at atmospheric pressure by being exposed to various process gases, depending on the constituency of the workpieces, and then may be further rinsed with de-ionized water prior to being aligned, mounted to respective chucks, and placed in a bonding chamber for bonding. It is appreciated, however, that cleaning and preparation of the surfaces 116 of the first workpiece 102 and second workpiece 104 is merely a preliminary step in attaining an adequate and acceptable bond between the workpieces.

In accordance with the present disclosure, it is appreciated that conventional bonding of workpieces has suffered from an ability to control a propagation of the so-called "bond wave" during bonding of the workpieces. For example, during bonding of the first workpiece 102 and second workpiece 104 shown in FIG. 2 in atmosphere using a conventional commercial bonding apparatus, the first and second workpieces 102 and 104 are positioned facing each other and placed in close proximity to one another for bonding thereof. Since the bonding is typically performed in atmospheric conditions, air or gases may be pushed out during the marriage between the first workpiece 102 and second workpiece 104; however, air or gases may be deleteriously entrapped between the first workpiece and second workpiece, thus causing defects 118 at an interface 120 in the resulting bonded product 122. Further, since the first workpiece 102 and second workpiece 104 are generally solid and typically constrained by a chucking tool during bonding, it has been difficult to control the propagation or spreading of the bond wave while achieving adequate alignment without the introduction of the entrapped air or gases causing the defects 118.

The present disclosure advantageously appreciates that surface treatment of the first workpiece 102 and second workpiece 104, as well as an overall vacuum or pressure level during bonding will affect a speed of the bond wave. As such, the present disclosure introduces a bonding system configured to control the bond wave by providing a localized pressure differential and in-situ monitoring of the propagation of the bond wave, whereby line yields (e.g., a measure of voids and defects in the resulting bonding workpieces) can be advantageously improved.

Thus, in accordance with one aspect of the present disclosure, and as illustrated in an example embodiment shown in FIG. 3, an exemplary workpiece bonding apparatus 200 is provided for controlling a propagation of a bond wave between a first workpiece 202 and a second workpiece 204 concurrent with a bonding of the first workpiece and second workpiece.

In accordance with several exemplary aspects of the present disclosure, the workpiece bonding apparatus 200 comprises a first chuck 206 configured to selectively secure the first workpiece 202 thereto. For example, the first chuck 206 is configured to selectively secure at least a periphery 208 of the first workpiece 202 to a first chuck surface 210 associated with the first chuck. In accordance with one example, the first chuck 206 comprises a first electrostatic chuck 212 (alternatively referred to as an electrostriction chuck). Accordingly, the first electrostatic chuck 212 may comprise one or more first chuck peripheral electrodes 214, wherein the one or more first chuck peripheral electrodes are configured to selectively electrostatically attract the periphery 208 of the first workpiece 202 toward the first chuck surface 210. Furthermore, according to another example, the first electrostatic chuck 212 may comprise one or more first chuck central electrodes 216, wherein the one or more first chuck central electrodes are configured to selectively electrostatically attract a central region 218 of the first workpiece 202 toward the first chuck surface 210. Any number of first chuck central electrodes 216 and first chuck peripheral electrodes 214 may be provided in the first electrostatic chuck 212, whereby the first central chuck electrodes and first chuck peripheral electrodes may be selectively activated to electrostatically secure the first workpiece 202 to the first chuck surface 210 to varying degrees across the first chuck surface by controlling a power or current provided to the respective first central chuck electrodes and first chuck peripheral electrodes.

In accordance with another exemplary aspect of the present disclosure, the workpiece bonding apparatus 200 comprises a second chuck 220 configured to selectively secure the second workpiece 204 thereto, wherein the second chuck is configured to selectively secure the second workpiece at a predetermined position 221 proximate to the first workpiece 202 (e.g., mechanically maintained at a spacing of less than 100 microns). For example, the second chuck 220 is configured to selectively secure at least a periphery 222 of the second workpiece 204 to a second chuck surface 224 associated with the second chuck. In accordance with one example, the second chuck 220 comprises a second electrostatic chuck 226 (alternatively referred to as an electrostriction chuck). Accordingly, the second electrostatic chuck 226 may comprise one or more second chuck peripheral electrodes 228, wherein the one or more second chuck peripheral electrodes are configured to selectively electrostatically attract the periphery 222 of the second workpiece 204 toward the second chuck surface 224. Furthermore, according to another example, the second electrostatic chuck 226 may comprise one or more second chuck central electrodes 230, wherein the one or more second chuck central electrodes are configured to selectively electrostatically attract a central region 232 of the second workpiece 204 toward the second chuck surface 224. Any number of second chuck central electrodes 230 and second chuck peripheral electrodes 228 may be provided in the second electrostatic chuck 226, whereby the second central chuck electrodes and second chuck peripheral electrodes may be selectively activated to electrostatically secure the second workpiece 204 to the second chuck surface 224 to varying degrees across the second chuck surface by controlling a power or current provided to the respective second central chuck electrodes and second chuck peripheral electrodes.

FIG. 4 illustrates an alternative embodiment, wherein another workpiece bonding apparatus 300 is provided having a first chuck 306 configured to selectively secure the first workpiece 202 thereto. For example, the first chuck 306 is configured to selectively secure at least the periphery 208 of the first workpiece 202 to a first chuck surface 310 associated with the first chuck. In the present example of FIG. 4, the first chuck 306 comprises a first vacuum chuck 312. Accordingly, the first vacuum chuck 312 may comprise one or more first chuck peripheral grooves 314, wherein the one or more first chuck peripheral grooves are configured to selectively attract the periphery 208 of the first workpiece 202 toward the first chuck surface 310 via a vacuum applied thereto. Furthermore, according to another example, the first vacuum chuck 312 may comprise one or more first chuck central grooves 316, wherein the one or more first chuck central grooves are configured to selectively attract the central region 218 of the first workpiece 202 toward the first chuck surface 210 via a vacuum applied thereto. Any number of first chuck central grooves 316 and first chuck peripheral grooves 314 may be provided in the first vacuum chuck 312, whereby the vacuum may be selectively applied to the first central chuck grooves and first chuck peripheral grooves to secure the first workpiece 202 to the first chuck surface 310, whereby the vacuum may be varied across the first chuck surface by controlling a flow through the respective first central chuck grooves and first chuck peripheral grooves.

In accordance with another exemplary aspect of the present disclosure, the workpiece bonding apparatus 300 of FIG. 4 comprises a second chuck 320 configured to selectively secure the second workpiece 204 thereto. For example, the second chuck 320 is configured to selectively secure at least the periphery 222 of the second workpiece 204 to a second chuck surface 324 associated with the second chuck. In accordance with one example, the second chuck 320 comprises a second vacuum chuck 326. Accordingly, the second vacuum chuck 326 may comprise one or more second chuck peripheral grooves 328, wherein the one or more second chuck peripheral grooves are configured to selectively attract the periphery 222 of the second workpiece 204 toward the second chuck surface 324 via a vacuum applied thereto. Furthermore, according to another example, the second vacuum chuck 326 may comprise one or more second chuck central grooves 330, wherein the one or more second chuck central grooves are configured to selectively attract a central region 332 of the second workpiece 204 toward the second chuck surface 324 via a vacuum applied thereto. Any number of second chuck central grooves 330 and second chuck peripheral grooves 328 may be provided in the second electrostatic chuck 320, whereby the vacuum may be selectively applied to the second central chuck grooves and second chuck peripheral to varying degrees to selectively secure the second workpiece 204 to the second chuck surface 324 whereby the vacuum may be varied across the second chuck surface by controlling a flow through the respective second central chuck grooves and second chuck peripheral grooves.

FIG. 5 illustrates another alternative embodiment, wherein yet another workpiece bonding apparatus 400 is provided having a first chuck 406 configured to selectively secure the first workpiece 202 thereto. For example, the first chuck 406 is configured to selectively secure at least the periphery 208 of the first workpiece 202 to a first chuck surface 410 associated with the first chuck. In the present example of FIG. 5, the first chuck 406 comprises a first mechanical chuck 412. Accordingly, the first mechanical chuck 412 may comprise one or more first chuck mechanical clamps 414, wherein the one or more first chuck mechanical clamps are configured to selectively secure the periphery 208 of the first workpiece 202 to the first chuck surface 410 via a mechanical actuation thereof (e.g., a rotation or other manipulation of the one or more first chuck mechanical clamps). Any number of first chuck mechanical clamps 414 may be provided in the first mechanical chuck 312, whereby the mechanical clamping may be selectively applied to periphery 208 of the first workpiece 202.

In accordance with another exemplary aspect of the present disclosure, the workpiece bonding apparatus 400 of FIG. 5 comprises a second chuck 420 configured to selectively secure the second workpiece 204 thereto. For example, the second chuck 420 is configured to selectively secure at least the periphery 222 of the second workpiece 204 to a second chuck surface 424 associated with the second chuck. In accordance with one example, the second chuck 420 comprises a second mechanical chuck 426. Accordingly, the second mechanical chuck 426 may comprise one or more second chuck mechanical clamps 428, wherein the one or more second chuck mechanical clamps are configured to selectively attract the periphery 222 of the second workpiece 204 to the second chuck surface 424 via a mechanical actuation thereof (e.g., a rotation or other manipulation of the one or more second chuck mechanical clamps).

Referring in general to FIG. 2, in accordance with another exemplary aspect of the present disclosure, a vacuum apparatus 500 is further provided and positioned in a peripheral region 502 generally defined between the first chuck 206 and second chuck 220 (e.g., between the first chuck 306 and second chuck 320 of FIG. 3 and between the first chuck 406 and second chuck 420 of FIG. 4). As illustrated in FIG. 2, for example, the peripheral region 502 is proximate to respective peripheries 208 and 222 of the first workpiece 202 and second workpiece 204. In accordance with one exemplary aspect, the vacuum apparatus 500 is configured to selectively induce a vacuum between opposing surfaces 504, 506 of the respective first workpiece 202 and second workpiece 204. As such, the vacuum induced between the opposing surfaces 504, 506 of the respective first workpiece 202 and second workpiece 204 selectively attracting the first workpiece and second workpiece toward one another from a propagation point 508 (e.g., a center of the first workpiece and second workpiece) via a pressure differential between the propagation point and the peripheral region 502.

In order to gain a better understanding of the present disclosure, several embodiments will now be provided with respect to the vacuum apparatus 500 using the workpiece bonding apparatus 200 of FIG. 3 as an example. It should be noted, however, that similar applications of the vacuum apparatus 500 may be applied to any other workpiece bonding apparatus, such as those shown in FIGS. 4 and 5. As illustrated in FIG. 3 and described above, the vacuum apparatus 500 is configured to selectively induce a vacuum (shown by arrows 510) between the opposing surfaces 504, 506 of the respective first workpiece 202 and second workpiece 204. The vacuum 510 generally forces the central region 218 of the first workpiece 202 and central region 232 of the second workpiece 204 toward one another, due to a pressure differential induced by the vacuum 510 between $P_1$ and $P_2$ where $P_1$ is less than $P_2$, as illustrated in FIG. 6. The pressure $P_2$, for example, may be atmospheric pressure or another pressure that is greater than the pressure $P_1$.

In accordance with one embodiment, the vacuum apparatus 500 comprises a plurality of localized vacuum guns 512, as illustrated in the example shown in the plan view of FIG. 7. The plurality of localized vacuum guns 512, for example, are positioned at a respective plurality of locations 514 about the peripheral region 502. As illustrated in the cross-sectional view of FIG. 8, each of the plurality of localized vacuum guns 512, for example, are configured to induce the vacuum 510, whereby the low pressure $P_1$ is generally localized and provides the pressure differential between $P_1$ and $P_2$ illustrated in FIG. 6 (e.g., again, $P_1 < P_2$). Further, the one or more first chuck peripheral grooves 314 and one or more second chuck peripheral grooves 328 selectively retain the peripheries 208 and 222 of the respective first workpiece 202 and second workpiece 204, while the one or more first chuck central grooves 316 and second chuck central grooves 330 selectively release the respective central region 218 of first workpiece and central region 232 of second workpiece.

It is to be appreciated that the first chuck peripheral electrodes 214, first chuck central electrodes 216, second chuck peripheral electrodes 228, and second chuck central electrodes 230 of FIG. 3 may be used in addition to, or substituted for, the respective first chuck peripheral grooves 314, first chuck central grooves 316, second chuck peripheral grooves 328, and second chuck central grooves 330 of FIG. 8. Likewise, the first chuck mechanical clamps 414 and second chuck mechanical clamps 428 of FIG. 5 may be used in addition to, or substituted for, the respective first chuck peripheral grooves 314 and second chuck peripheral grooves 328 of FIG. 8.

In one example, the low pressure $P_1$ provided by the vacuum apparatus 500 of FIG. 8 first overcomes the retaining vacuum provided by the one or more first chuck central grooves 316 and second chuck central grooves 330 while the one or more first chuck peripheral pumping grooves 314 and one or more second chuck peripheral grooves 328 may provide a greater retaining vacuum that is not overcome by the low pressure $P_1$. In other words, the vacuum provided by the first chuck central grooves 316 and second chuck central grooves 330, as well as the one or more first chuck peripheral pumping grooves 314 and one or more second chuck peripheral grooves 328 may be selectively varied or otherwise controlled in order to provide a propagation of the bonding of the first and second workpieces 202, 204 from the propagation point 508 of FIG. 7.

While FIG. 7 illustrates the vacuum apparatus 500 comprising three localized vacuum guns 512 being generally equally spaced about the peripheral region 502 at three locations 514, the present disclosure contemplates any number of localized vacuum guns being spaced equally or unequally about the peripheral region, and all such configurations of the plurality of localized vacuum guns are contemplated as falling within the scope of the present disclosure. For example, as illustrated in FIG. 9, eight localized vacuum guns 512 are provided at eight respective locations 514, whereby the localized vacuum guns are not equally spaced about the peripheral region 502. According to one example, if the low pressure $P_1$ of FIG. 8 is kept constant for all of the eight localized vacuum guns 512 of FIG. 9, such a configuration shown in FIG. 9 may be provided to shift or alter the propagation point 508 from a center 550 of the first workpiece 202. Such a shifting of the propagation point 508, for example, may be advantageous for controlling the bonding of the first workpiece 202 and second workpiece 204 of FIGS. 3-6 based on the constituency, physical configuration, or shape of the respective first and second workpieces.

According to another example, each of the plurality of localized vacuum guns 512 of either of FIG. 7 or 9 may be configured to independently provide a respective localized vacuum pressure $P_1$ of FIG. 8 that may vary from one localized vacuum gun to another, wherein the propagation point 508 is further variable based on the respective localized vacuum pressures provided by the plurality of localized vacuum guns.

Figure 10:
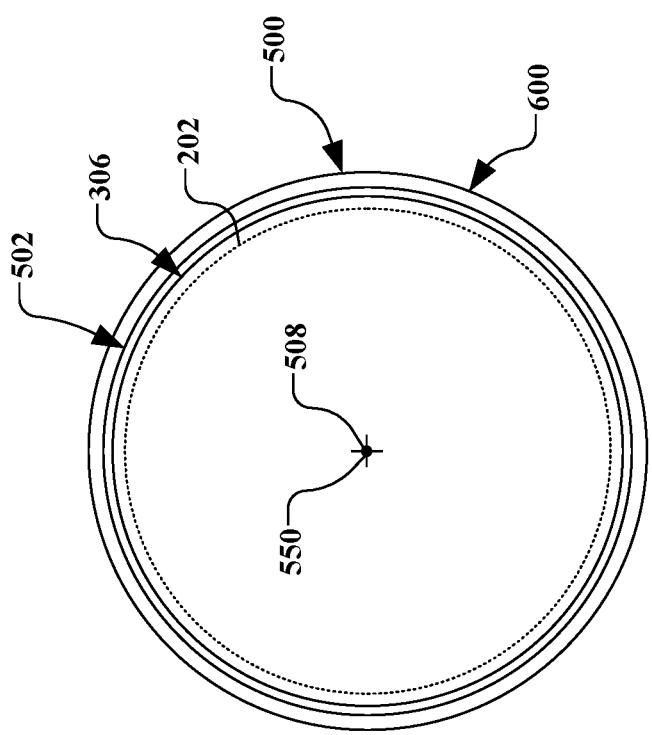
FIG. 10 illustrates a schematic plan view of some embodiments of a bonding apparatus consistent having a vacuum disk.

In another example embodiment, the vacuum apparatus 500 comprises a vacuum disk 600 illustrated in FIG. 10, wherein the vacuum disk is configured to provide a substantially uniform vacuum at the low pressure $P_1$ about the peripheral region 502. Accordingly, the propagation point 508 is generally centered with respect to the opposing surfaces of the first workpiece 202 and second workpiece 204 of FIG. 11 (e.g., the center 550 of FIG. 10 coincides with the propagation point 508). In a similar manner as described above, as illustrated in FIG. 11, the one or more first chuck peripheral pumping grooves 314 and one or more second chuck peripheral grooves 328 selectively retain the peripheries 208 and 222 of the respective first workpiece 202 and second workpiece 204, while the one or more first chuck central grooves 316 and second chuck central grooves 330 may selectively release, or provide less vacuum to, the respective central region 218 of first workpiece and central region 232 of second workpiece.

In one example, the low pressure $P_1$ provided by the vacuum disk 600 first overcomes the retaining vacuum provided by the one or more first chuck central grooves 316 and second chuck central grooves 330 while the one or more first chuck peripheral pumping grooves 314 and one or more second chuck peripheral grooves 328 may provide a retaining vacuum that is not overcome by the low pressure $P_1$ upon initiation of the bonding wave from the propagation point. In other words, the vacuum provided by the first chuck central grooves 316 and second chuck central grooves 330, as well as the one or more first chuck peripheral pumping grooves 314 and one or more second chuck peripheral grooves 328 may be selectively varied or otherwise controlled in order to provide a propagation of the bonding of the first and second workpieces 202, 204 from the propagation point 508 of FIG. 10.

Figure 13:
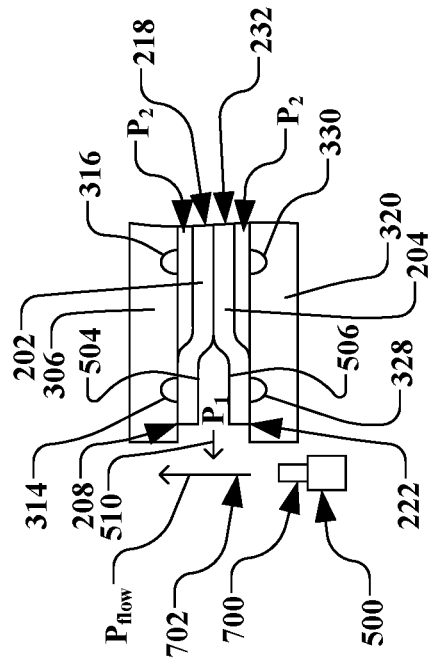
FIG. 13 illustrates a partial cross-sectional view of some embodiments of a bonding apparatus having a gas curtain.
Figure 12:
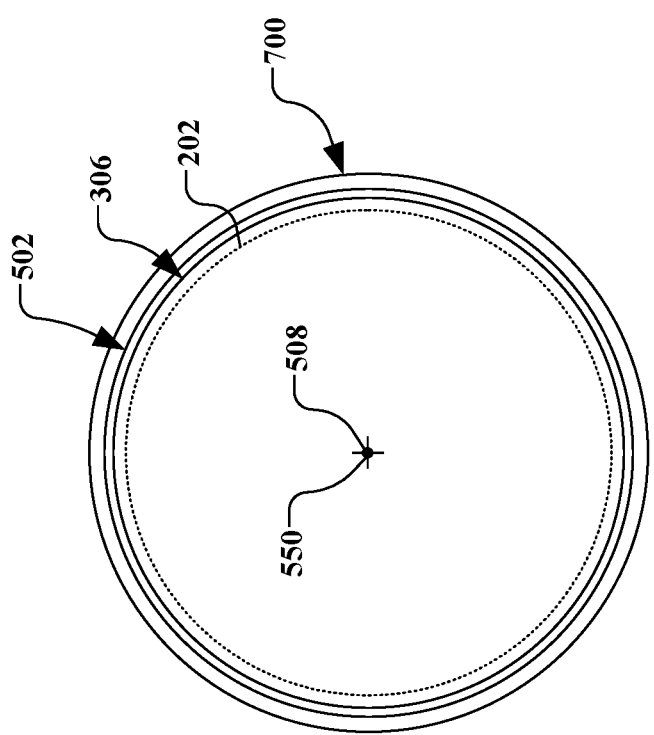
FIG. 12 illustrates a schematic plan view of some embodiments of a bonding apparatus consistent having a gas curtain.

In yet another example embodiment, the vacuum apparatus 500 comprises a gas curtain apparatus 700 illustrated in FIG. 12. The gas curtain apparatus 700, for example, is positioned in the peripheral region 502, wherein the gas curtain apparatus is configured to emit a gas (e.g., air, an inert gas such as nitrogen, or another gas) at a first pressure $P_{flow}$ along a path 702 that is not parallel to the opposing surfaces 504, 506 of the first workpiece 202 and second workpiece 204, as illustrated in FIG. 13. For example, the path 702 may be generally perpendicular or otherwise angled with respect to the opposing surfaces 504, 506 of the first workpiece 202 and second workpiece 204. Accordingly, the emission of the gas at the first pressure $P_{flow}$ along the path 702 induces the vacuum 510 or low pressure $P_1$ between the first workpiece 202 and second workpiece 204 via the Bernoulli Effect. The gas curtain apparatus 700, for example, may comprise a plurality of nozzles (not shown), or a unitary orifice (not shown) that encircles the peripheral region 502 illustrated in FIG. 12.

In accordance with another example, a propagation initiation apparatus 710 illustrated in FIG. 6 may be further provided, wherein the propagation initiation apparatus is configured to selectively press one or more of the first workpiece 202 and second workpiece 204 toward the other at the propagation point 508. The propagation initiation apparatus 710, for example, may comprise a pin 712 or other mechanism configured to selectively press one or more of the first workpiece 202 and second workpiece 204 toward the other at the propagation point 508.

According to yet another example embodiment, any of the workpiece bonding apparatuses 200, 300, 400 of FIGS. 3-6 may further comprise a displacement sensing device 800 such as a wide-angle IR CCD 802, wherein the displacement sensing device is advantageously configured to monitor the bond wave between the first workpiece 202 and second workpiece 204 concurrent with the attraction therebetween, as discussed above. Such a monitoring of the bond wave (e.g., the propagation of the bonding of the first workpiece 202 and second workpiece 204 from the propagation point 508 outward toward the peripheral region 502), for example, could be advantageously utilized to control the vacuum 510 provided by any of the vacuum apparatuses 500 described above.

Figure 14:
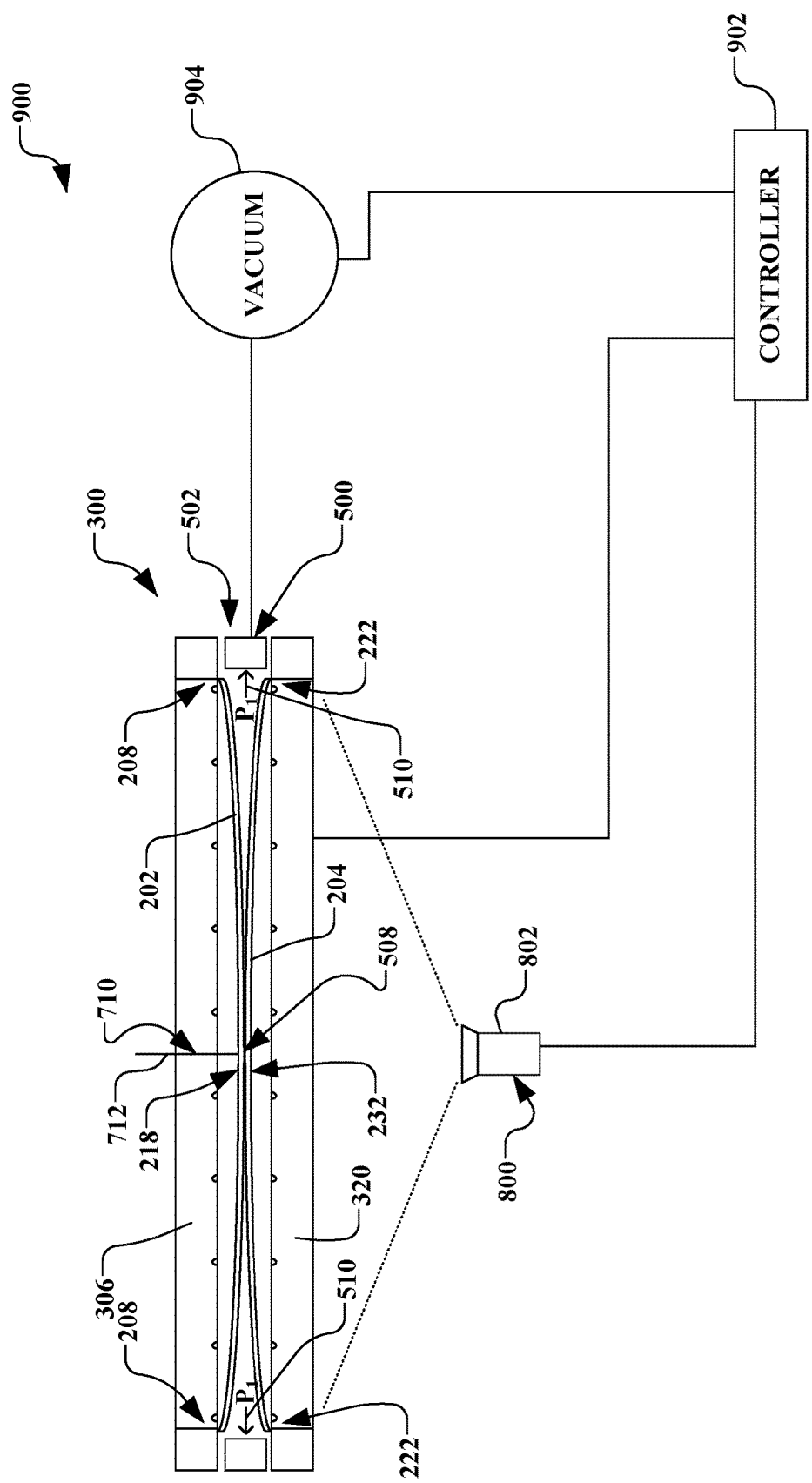
FIG. 14 illustrates a system for bonding two workpieces in accordance with some embodiments.

FIG. 14 illustrates another exemplary aspect of the present disclosure, wherein a workpiece bonding system 900 is provided for controlling a propagation of a bond wave between the first workpiece 202 and second workpiece 204 utilizing any of workpiece bonding apparatuses 200, 300, 400 of FIGS. 3-6. The present example uses the workpiece bonding apparatus 300 of FIGS. 4 and 6 for illustrative purposes. The workpiece bonding system 900, of FIG. 14, for example, comprises a controller 902 configured to selectively secure the first workpiece 202 to the first chuck 306, as well as selectively secure the second workpiece 204 to the second chuck 320 at a predetermined position proximate to the first workpiece via a control of the first and second chucks.

According to various examples, the workpiece bonding system 900 further comprises the vacuum apparatus 500, wherein the controller 902 is configured to control a vacuum pump 904 associated with the vacuum apparatus to selectively induce the vacuum 510 between the first workpiece 202 and second workpiece 204. Accordingly, the controller of 902 is configured to selectively attract the opposing surfaces 504, 506 of the respective first workpiece 202 and second workpiece 204 toward one another from the propagation point 508 due to the pressure differential between the propagation point and the peripheral region 502.

It should be understood that the controller 902 of the workpiece bonding system 900 further may be configured to control any aspect of any of the vacuum apparatuses 500 described herein. For example, the controller 902 may be configured to further monitor of the bond wave (e.g., the propagation of the bonding of the first workpiece 202 and second workpiece 204 from the propagation point 508 outward toward the peripheral region 502), whereby the vacuum 510 may be further controlled controlling one or more of the vacuum pump 904, and a location and pressure associated with the vacuum apparatus 500 (e.g., the vacuum associated with plurality of localized vacuum guns 512 and/or respective plurality of locations 514 of FIGS. 7-9).

Figure 15:
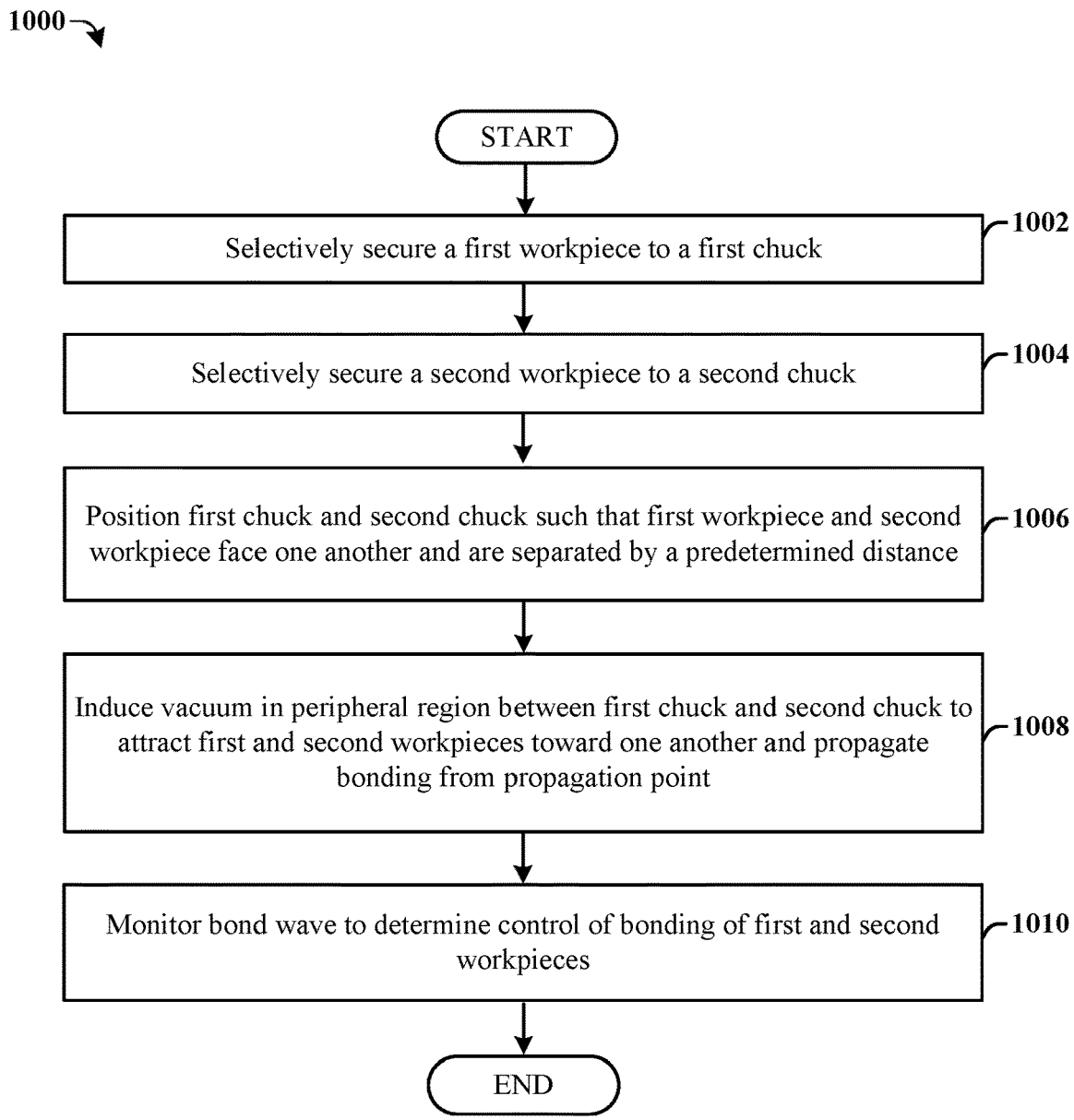
FIG. 15 illustrates a flow diagram of some embodiments of using a metal isolation test circuit.

The present disclosure further provides a method 1000 illustrated in FIG. 15 for controlling a propagation of a bond wave concurrent with a bonding of a first workpiece to a second workpiece, such as can be utilized in any of the preceding discussion. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

As illustrated in FIG. 15, the method 1000 begins at act 1002, wherein a first workpiece is selectively secured to a first chuck. For example, the first workpiece 202 of any of FIGS. 3-6 may be selectively secured to the any of the first chucks 206, 306, 406 of respective FIGS. 3-5.

In act 1004 of FIG. 15, a second workpiece is selective secured to a second chuck. For example, the second workpiece 204 of any of FIGS. 3-6 may be selectively secured to the any of the second chucks 220, 320, 420 of respective FIGS. 3-5.

In one example, selectively securing the first workpiece to the first chuck in act 1002 of FIG. 15 and selectively securing the second workpiece in act 1004 to the second chuck respectively comprises securing at least a respective periphery of the first workpiece and second workpiece, such as the peripheries 208 and 222 of the respective first and second workpiece 202 and 204 of respective FIGS. 3-5.

In act 1006 of FIG. 15, the first chuck and second chuck are positioned such that opposing surfaces of the respective first workpiece and second workpiece face one another. For example, the first chucks 206, 306, 406 and second chucks 220, 320, 420 of respective FIGS. 3-5 are positioned such that the opposing surfaces 504, 506 of the respective first workpiece 202 and second workpiece 204 face one another and are separated by a predetermined distance (e.g., approximately 100 microns or less).

In act 1008 of FIG. 15, a vacuum is induced in a peripheral region generally defined between the first chuck and second chuck, wherein the vacuum attracts the first workpiece and second workpiece toward one another from a propagation point via a pressure differential between the propagation point and the peripheral region. For example, the vacuum pump 904 of FIG. 14 is utilized to induce the vacuum 510 in the peripheral region 502 between the first and second chucks 306, 320. Such induction of the vacuum 520 induces the first and second workpieces 202, 204 to be attracted to one another from the propagation point 508 due to the pressure differential described above.

Inducing the vacuum between the first chuck and second chuck in the peripheral region in act 1008 of FIG. 15, for example, may comprise inducing a plurality of localized vacuum pressures at a plurality of locations about the peripheral region, wherein the propagation point is defined based on the plurality of localized vacuum pressures, such as illustrated and described above in reference to FIGS. 7-9.

Figure 11:
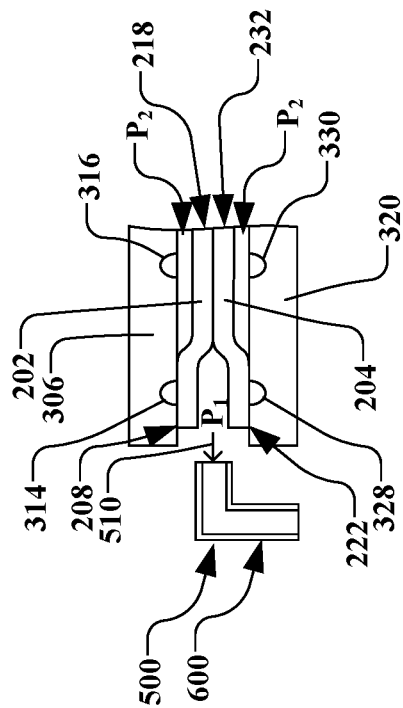
FIG. 11 illustrates a partial cross-sectional view of some embodiments of a bonding apparatus having a vacuum disk.

Alternatively, inducing the vacuum between the first chuck and second chuck in the peripheral region in act 1008 of FIG. 15, for example, may comprise providing a substantially uniform vacuum about the periphery of the region between the first chuck and second chuck via a vacuum disk positioned about the periphery, such as illustrated and described in reference to FIGS. 10-11.

In yet another example, inducing the vacuum between the first chuck and second chuck in the peripheral region in act 1008 of FIG. 15, for example, may comprise emitting a gas in the peripheral region at a first pressure along a path that is not parallel to opposing surfaces of the respective first workpiece and second workpiece, therein inducing the vacuum between the first workpiece and second workpiece via the Bernoulli Effect, such as illustrated and described above with reference to FIGS. 12-13.

Act 1008, for example, may comprise providing a substantially uniform vacuum about the peripheral region, wherein the propagation point is generally centered with respect to opposing surfaces of the respective first workpiece and second workpiece.

In another example, one or more of the first workpiece and second workpiece may be further pressed toward one another at the propagation point, thereby initiating the attraction of the first workpiece and second workpiece toward one another.

In yet another example, the method 1000 may further comprise monitoring the bond wave via one or more of a wide-angle IR CCD and a displacement sensing device in act 1010, whereby the monitoring of the bond wave may be further utilized to control the vacuum induced in act 1008.

Thus, in accordance with various aspects of the disclosure, a workpiece bonding apparatus is provided for controlling a propagation of a bond wave between a first workpiece and a second workpiece. The workpiece bonding apparatus comprises a first chuck configured to selectively secure the first workpiece and a second chuck configured to selectively secure the second workpiece at a predetermined position proximate to the first workpiece. A vacuum apparatus is positioned in a peripheral region generally defined between the first chuck and second chuck, wherein the peripheral region is proximate to respective peripheries of the first workpiece and second workpiece. The vacuum apparatus is configured to selectively induce a vacuum between opposing surfaces of the first workpiece and second workpiece, therein selectively attracting the first workpiece and second workpiece toward one another from a propagation point via a pressure differential between the propagation point and the peripheral region.

In some embodiments, the first chuck and second chuck are configured to selectively secure at least the respective peripheries of the first workpiece and second workpiece. One or more of the first chuck and second chuck may respectively comprise one of an electrostatic chuck, a vacuum chuck, and a mechanical chuck.

In various embodiments, the vacuum apparatus comprises a plurality of localized vacuum guns positioned at a respective plurality of locations about the peripheral region. In some examples, each of the plurality of localized vacuum guns is configured to independently provide a respective localized vacuum pressure, wherein the propagation point is variable based on the respective localized vacuum pressures provided by the plurality of localized vacuum guns.

The vacuum apparatus comprises, in some embodiments, a vacuum disk that is configured to provide a substantially uniform vacuum about the peripheral region, wherein the propagation point is generally centered with respect to the opposing surfaces of the first workpiece and second workpiece.

In other embodiments, the vacuum apparatus comprises a gas curtain apparatus positioned in the peripheral region, wherein the gas curtain apparatus is configured to emit a gas at a first pressure along a path that is not parallel to the opposing surfaces of the first workpiece and second workpiece. The gas curtain apparatus, for example, is configured to induce the vacuum between the first workpiece and second workpiece via the Bernoulli Effect.

A propagation initiation apparatus may be provided in some embodiments and configured to selectively press one or more of the first workpiece and second workpiece toward the other at the propagation point.

Some embodiments further comprise one or more of a wide-angle IR CCD and a displacement sensing device configured to monitor the bond wave between the first and second workpiece concurrent with the attraction therebetween.

In another embodiment, a method is provided for controlling a propagation of a bond wave concurrent with a bonding of a first workpiece to a second workpiece. The method, for example, comprises selectively securing the first workpiece to a first chuck and selectively securing the second workpiece to a second chuck, where the first chuck and second chuck are further positioned such that opposing surfaces of the respective first workpiece and second workpiece face one another. A vacuum is induced in a peripheral region generally defined between the first chuck and second chuck, wherein the vacuum attracts the first workpiece and second workpiece toward one another from a propagation point via a pressure differential between the propagation point and the peripheral region.

In some embodiments, selectively securing the first workpiece to the first chuck and selectively securing the second workpiece to the second chuck respectively comprises securing at least a respective periphery of the first workpiece and second workpiece.

Inducing the vacuum between the first chuck and second chuck in the peripheral region in some embodiments comprises inducing a plurality of localized vacuum pressures at a plurality of locations about the peripheral region, wherein the propagation point is defined based on the plurality of localized vacuum pressures.

In other embodiments, inducing the vacuum between the first chuck and second chuck in the peripheral region comprises providing a substantially uniform vacuum about the periphery of the region between the first chuck and second chuck via a vacuum disk positioned about the periphery.

In yet other embodiments, inducing the vacuum between the first chuck and second chuck in the peripheral region comprises emitting a gas in the peripheral region at a first pressure along a path that is not parallel to opposing surfaces of the respective first workpiece and second workpiece, therein inducing the vacuum between the first workpiece and second workpiece via the Bernoulli Effect.

Inducing the vacuum between the first chuck and second chuck in the peripheral region in some embodiments may comprise provide a substantially uniform vacuum about the peripheral region, wherein the propagation point is generally centered with respect to opposing surfaces of the respective first workpiece and second workpiece.

In other example embodiments, one or more of the first workpiece and second workpiece are pressed toward the other at the propagation point, thereby initiating the attraction of the first workpiece and second workpiece toward one another.

In still other embodiments, the method further comprises monitoring the bond wave via one or more of a wide-angle IR CCD and a displacement sensing device.

A workpiece bonding system for controlling a propagation of a bond wave between a first workpiece and a second workpiece is further provided in another embodiment. The workpiece bonding system for example, comprises a first chuck configured to selectively secure the first workpiece and a second chuck configured to selectively secure the second workpiece at a predetermined position proximate to the first workpiece. A vacuum apparatus may be positioned in a peripheral region generally defined between the first chuck and second chuck, wherein the peripheral region is proximate to respective peripheries of the first workpiece and second workpiece. Further a controller may be provided and configured to selectively induce a vacuum between opposing surfaces of the first workpiece and second workpiece via a control of the vacuum apparatus, therein selectively attracting the opposing surfaces of the respective first workpiece and second workpiece toward one another from a propagation point due to a pressure differential between the propagation point and the peripheral region.

In some embodiments, the vacuum apparatus comprises a plurality of localized vacuum guns positioned at a respective plurality of locations about the peripheral region, wherein the controller is further configured to control a localized vacuum pressure respectively associated with each of the plurality of localized vacuum guns, thereby controlling a position of the propagation point.

In yet other embodiments, the vacuum apparatus comprises one of a vacuum disk and a gas curtain apparatus, wherein the vacuum disk is configured to provide a substantially uniform vacuum about the peripheral region, and wherein the gas curtain apparatus is configured to emit a gas at a first pressure along a path that is not parallel to the opposing surfaces of the first workpiece and second workpiece, whereby the gas curtain apparatus is configured to induce the vacuum between the first workpiece and second workpiece via the Bernoulli Effect.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

What is claimed is:

1. A workpiece bonding apparatus for controlling a propagation of a bond wave between a first workpiece and a second workpiece, the workpiece bonding apparatus comprising:
   a first chuck configured to selectively secure the first workpiece;
   a second chuck configured to selectively secure the second workpiece at a predetermined position proximate to the first workpiece; and
   a vacuum apparatus positioned between the first chuck and second chuck proximate to respective peripheries of the first workpiece and second workpiece, wherein the vacuum apparatus is configured to selectively induce a vacuum between opposing surfaces of the first workpiece and second workpiece, therein selectively attracting the first workpiece and second workpiece toward one another.

2. The workpiece bonding apparatus of claim 1, wherein the first chuck and second chuck are configured to selectively secure at least the respective peripheries of the first workpiece and second workpiece.

3. The workpiece bonding apparatus of claim 2, wherein one or more of the first chuck and second chuck respectively comprise one of an electrostatic chuck, a vacuum chuck, and a mechanical chuck.

4. The workpiece bonding apparatus of claim 1, wherein the vacuum apparatus comprises a plurality of localized vacuum guns positioned at a respective plurality of locations between the first chuck and second chuck.

5. The workpiece bonding apparatus of claim 4, wherein each of the plurality of localized vacuum guns is configured to independently provide a respective localized vacuum pressure, wherein a propagation point associated with the attraction of the first workpiece and second workpiece toward one another is variable based on the respective localized vacuum pressures provided by the plurality of localized vacuum guns.

6. The workpiece bonding apparatus of claim 1, wherein the vacuum apparatus comprises a vacuum disk configured to provide a substantially uniform vacuum between the first chuck and second chuck, wherein a propagation point associated with the attraction of the first workpiece and second workpiece toward one another is generally centered with respect to the opposing surfaces of the first workpiece and second workpiece.

7. The workpiece bonding apparatus of claim 1, wherein the vacuum apparatus comprises a gas curtain apparatus positioned between the first chuck and second chuck, wherein the gas curtain apparatus is configured to emit a gas at a first pressure along a path that is not parallel to the opposing surfaces of the first workpiece and second workpiece, and wherein the gas curtain apparatus is configured to induce the vacuum between the first workpiece and second workpiece via the Bernoulli Effect.

8. The workpiece bonding apparatus of claim 1, further comprising a propagation initiation apparatus configured to selectively press one or more of the first workpiece and second workpiece toward the other at a propagation point.

9. The workpiece bonding apparatus of claim 1, further comprising one or more of a wide-angle IR CCD and a displacement sensing device configured to monitor the bond wave between the first and second workpiece concurrent with the attraction therebetween.

10. A method for controlling a propagation of a bond wave concurrent with a bonding of a first workpiece to a second workpiece, the method comprising:
    selectively securing the first workpiece to a first chuck;
    selectively securing the second workpiece to a second chuck;
    positioning the first chuck and second chuck such that opposing surfaces of the respective first workpiece and second workpiece face one another; and
    inducing a vacuum between the first chuck and second chuck, wherein the vacuum attracts the first workpiece and second workpiece toward one another.

11. The method of claim 10, wherein selectively securing the first workpiece to the first chuck and selectively securing the second workpiece to the second chuck respectively comprises securing at least a respective periphery of the first workpiece and second workpiece.

12. The method of claim 10, wherein inducing the vacuum between the first chuck and second chuck comprises inducing a plurality of localized vacuum pressures at a plurality of locations about a peripheral region generally defined between the first chuck and second chuck, wherein a propagation point is defined based on the plurality of localized vacuum pressures.

13. The method of claim 10, wherein inducing the vacuum between the first chuck and second chuck comprises providing a substantially uniform vacuum about a periphery of a region between the first chuck and second chuck via a vacuum disk positioned about the periphery.

14. The method of claim 10, wherein inducing the vacuum between the first chuck and second chuck comprises emitting a gas in a peripheral region generally defined between the first chuck and second chuck, wherein the gas is emitted along a path that is not parallel to opposing surfaces of the respective first workpiece and second workpiece, therein inducing the vacuum between the first workpiece and second workpiece via the Bernoulli Effect.

15. The method of claim 10, wherein inducing the vacuum between the first chuck and second chuck comprises providing a substantially uniform vacuum about a peripheral region generally defined between the first chuck and second chuck, wherein a propagation point is generally centered with respect to opposing surfaces of the respective first workpiece and second workpiece.

16. The method of claim 10, further comprising pressing one or more of the first workpiece and second workpiece toward the other at a propagation point, thereby initiating the attraction of the first workpiece and second workpiece toward one another.

17. The method of claim 10, further comprising monitoring the bond wave via one or more of a wide-angle IR CCD and a displacement sensing device.

18. A workpiece bonding system for controlling a propagation of a bond wave between a first workpiece and a second workpiece, the system comprising:
   a first chuck configured to selectively secure the first workpiece;
   a second chuck configured to selectively secure the second workpiece at a predetermined position proximate to the first workpiece;
   a vacuum apparatus positioned generally defined between the first chuck and second chuck proximate to respective peripheries of the first workpiece and second workpiece; and
   a controller configured to selectively induce a vacuum between opposing surfaces of the first workpiece and second workpiece via a control of the vacuum apparatus, therein selectively attracting the opposing surfaces of the respective first workpiece and second workpiece toward one another.

19. The workpiece bonding system of claim 18, wherein the vacuum apparatus comprises a plurality of localized vacuum guns, and wherein the controller is further configured to control a localized vacuum pressure respectively associated with each of the plurality of localized vacuum guns, thereby controlling a position of a propagation point.

20. The workpiece bonding system of claim 18, wherein the vacuum apparatus comprises one of a vacuum disk and a gas curtain apparatus, wherein the vacuum disk is configured to provide a substantially uniform vacuum about a peripheral region generally defined between the first chuck and second chuck, and wherein the gas curtain apparatus is configured to emit a gas at a first pressure along a path that is not parallel to the opposing surfaces of the first workpiece and second workpiece, whereby the gas curtain apparatus is configured to induce the vacuum between the first workpiece and second workpiece via the Bernoulli Effect.

* * * * *